United States Patent
Yamamoto et al.

(10) Patent No.: US 10,249,784 B2
(45) Date of Patent: Apr. 2, 2019

(54) OPTICAL SENSOR CAPABLE OF BEING APPLIED TO A TILT SENSOR

(71) Applicant: HAMAMATSU PHOTONICS K.K., Hamamatsu-shi, Shizuoka (JP)

(72) Inventors: Koei Yamamoto, Hamamatsu (JP); Hiroshi Okamoto, Hamamatsu (JP); Masaomi Takasaka, Hamamatsu (JP); Yuki Okuwa, Hamamatsu (JP); Shinya Iwashina, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 34 days.

(21) Appl. No.: 15/305,371

(22) PCT Filed: Apr. 23, 2015

(86) PCT No.: PCT/JP2015/062408
§ 371 (c)(1),
(2) Date: Oct. 20, 2016

(87) PCT Pub. No.: WO2015/163420
PCT Pub. Date: Oct. 29, 2015

(65) Prior Publication Data
US 2017/0047470 A1 Feb. 16, 2017

(30) Foreign Application Priority Data
Apr. 25, 2014 (JP) ................... 2014-092084

(51) Int. Cl.
*H01L 31/16* (2006.01)
*H01L 31/0232* (2014.01)
(Continued)

(52) U.S. Cl.
CPC ...... *H01L 31/165* (2013.01); *H01L 31/02325* (2013.01); *H01L 33/60* (2013.01); *G01C 2009/066* (2013.01)

(58) Field of Classification Search
CPC ........................................... G01D 5/30
See application file for complete search history.

(56) References Cited

U.S. PATENT DOCUMENTS

| 8,604,436 B1 | 12/2013 | Patel et al. |
| 2008/0285914 A1 | 11/2008 | Matsuoka et al. |

FOREIGN PATENT DOCUMENTS

| CN | 1681018 | 10/2005 |
| CN | 101079413 | 11/2007 |

(Continued)

OTHER PUBLICATIONS

International Preliminary Report on Patentability dated Nov. 3, 2016 for PCT/JP2015/062408.

*Primary Examiner* — Tony Ko
(74) *Attorney, Agent, or Firm* — Drinker Biddle & Reath LLP

(57) ABSTRACT

An optical sensor includes: a light emitting element 40; a lower substrate 20 on which the light emitting element 40 is provided; an upper substrate 10 provided so that the light emitting element 40 is positioned between the upper substrate 10 and the lower substrate 20; and an optical block 30 provided on the upper substrate 10. The upper substrate 10 includes a division-type photodiode SD. The optical block 30 is configured to reflect light emitted from the light emitting element 40 toward a measurement target R, and light reflected by the measurement target R is incident onto the division-type photodiode SD.

12 Claims, 20 Drawing Sheets

(51) Int. Cl.
 *H01L 33/60* (2010.01)
 *G01C 9/06* (2006.01)

(56) References Cited

FOREIGN PATENT DOCUMENTS

| | | | |
|---|---|---|---|
| JP | H05-37357 A | 2/1993 | |
| JP | H09-251663 A | 9/1997 | |
| JP | 2000-294831 A | 10/2000 | |
| JP | 2003-101063 A | 4/2003 | |
| JP | 2005-043192 A | 2/2005 | |
| JP | 2007-048400 A | 2/2007 | |
| JP | 2003-202530 | * 10/2007 | ............... G01D 5/30 |
| JP | 2007-317753 A | 12/2007 | |
| JP | 2009-010044 A | 1/2009 | |
| JP | 2009-267126 A | 11/2009 | |
| JP | 2010-009682 A | 1/2010 | |
| TW | 469621 | 1/2014 | |

* cited by examiner

OPTICAL SENSOR CAPABLE OF BEING APPLIED TO A TILT SENSOR

TECHNICAL FIELD

The present invention relates to an optical sensor capable of irradiating an object with light emitted from a light emitting element, detecting light reflected by the object, and being applied to a tilt sensor.

BACKGROUND ART

In the related art, an apparatus that uses a combination of a light emitting element and a light detecting unit is known.

For example, in a light emitting apparatus disclosed in Patent Literature 1, a light detecting unit that detects light emitted from an LED chip and a temperature detecting unit that detects a temperature of the light detecting unit are provided in a package in which the LED chip is accommodated. By subtracting an output of the temperature detecting unit from an output of the light detecting unit, noise due to the temperature of the light detecting unit is removed from an output signal of the light detecting unit. In this apparatus, by feeding back the output of the light detecting unit to driving of the LED chip, stabilization of light emission of the LED chip is achieved. However, in this apparatus, a sensor function is not provided.

On the other hand, an apparatus disclosed in Patent Literature 2 is an optical encoder that use a combination of a light emitting element and a light detecting unit, and has a sensor function. In the optical encoder, a light detector and a recess are formed on a semiconductor substrate. A light source is disposed in the recess. Further, a slit is disposed on the recess, so that a light beam emitted from the light source passes through the slit, and then, is irradiated to an optical pattern for an encoder.

CITATION LIST

Patent Literature

[Patent Literature 1] Japanese Unexamined Patent Publication No. 2009-10044

[Patent Literature 2] Japanese Unexamined Patent Publication No. 2005-43192

SUMMARY OF INVENTION

Technical Problem

However, in the related art, a small optical sensor capable of being applied to a tilt sensor is not known. The present invention is made in consideration of the above-mentioned problem, and provides a small optical sensor capable of being applied to a tilt sensor.

Solution to Problem

According to an aspect of the invention to solve the problem, there is provided an optical sensor including: a light emitting element; a lower substrate on which the light emitting element is provided; an upper substrate provided so that the light emitting element is positioned between the upper substrate and the lower substrate; and an optical block provided on the upper substrate, in which the upper substrate includes a position detection type light detecting element, and the optical block is configured to reflect light emitted from the light emitting element toward a measurement target, and light reflected by the measurement target is incident onto the position detection type light detecting element.

The lower substrate, the upper substrate, the optical block, and the light emitting element are integrated, and the upper substrate is provided with the position detection type light detecting element. The position detection type light detecting element can detect light that is incident to a measurement target and is reflected therefrom using the optical block. Since a light incidence position with respect to the position detection type light detecting element varies according to a rotational angle of the measurement target, this optical sensor can function as a tilt sensor. Here, due to integration, it is possible to reduce the size of the entire apparatus.

Further, the upper substrate includes a semiconductor substrate main body of a first conductivity type (N-type, for example) having an impurity concentration of $1 \times 10^{18}/cm^3$ or greater, a first semiconductor region of the first conductivity type (N-type, for example) formed on a front surface of the semiconductor substrate main body and having an impurity concentration of less than $1 \times 10^{18}/cm^3$, and a single or a plurality of second semiconductor regions of a second conductivity type (P-type, for example) formed in the first semiconductor region, and the position detection type light detecting element includes the first semiconductor region and the second semiconductor region.

In a case where the semiconductor substrate main body has a high impurity concentration ($1 \times 10^{18}/cm^3$ or greater), it is possible to block light incident onto the position detection type light emitting element positioned on the front surface from a substrate rear surface side, and thus, it is possible to perform accurate measurement.

Further, the upper substrate further includes a monitor photodiode, and the optical block is configured to further reflect the light emitted from the light emitting element toward the monitor photodiode.

By using the monitor photodiode, it is possible to stabilize a drive electric current supplied to the light emitting element according to an output of the monitor photodiode. Since the monitor photodiode and the division-type photodiode are integrated inside the upper substrate and light from the light emitting element is reflected and deflected using the optical block, it is possible to reduce the size of the optical sensor.

Further, the upper substrate includes a semiconductor substrate main body of a second conductivity type, a first semiconductor region of a first conductivity type formed on a front surface of the semiconductor substrate main body, and a single or a plurality of second semiconductor regions of the second conductivity type formed in the first semiconductor region, and the position detection type light detecting element includes the first semiconductor region and the second semiconductor region.

With such a structure, the optical sensor performs its function, but in a case where the semiconductor substrate main body is a P-type, a PN junction is formed between the semiconductor substrate main body and an N-type semiconductor region thereon. Accordingly, it is possible to use the PN junction as a monitor photodiode. In this case, it is possible to extract an output of the monitor photodiode from each electrode which is electrically connected to the semiconductor substrate main body and the N-type semiconductor region.

Further, the optical block includes a half mirror block and a full mirror block that overlaps the half mirror block, the half mirror block includes a first flat transparent plate and a half mirror layer that is embedded in the first flat transparent plate along a first inclined plane having, as a line normal thereto, a straight line having an angle inclined with respect to a line normal to a front surface of the first flat transparent plate, and the full mirror block includes a second flat transparent plate and a full mirror layer that is embedded in the second flat transparent plate along a second inclined plane having, as a line normal thereto, a straight line having an angle inclined with respect to a line normal to a front surface of the second flat transparent plate.

It is possible to reflect light from the light emitting element toward a measurement target using the half mirror layer, and it is possible to reflect light having passed through the half mirror layer toward the monitor photodiode using the full mirror layer.

Further, each of the lower substrate and the upper substrate is provided with a recess that forms a space that accommodates the light emitting element. Since the light emitting element is disposed in the recess, it is possible to reduce the size of the substrates in a thickness direction.

The position detection type light detecting element is a division-type photodiode or a position sensitive detector (PSD).

Advantageous Effects of Invention

According to the invention, it is possible to provide an optical sensor having a small size with a structure that is applicable to a tilt sensor.

DESCRIPTION OF EMBODIMENTS

Figure 1:
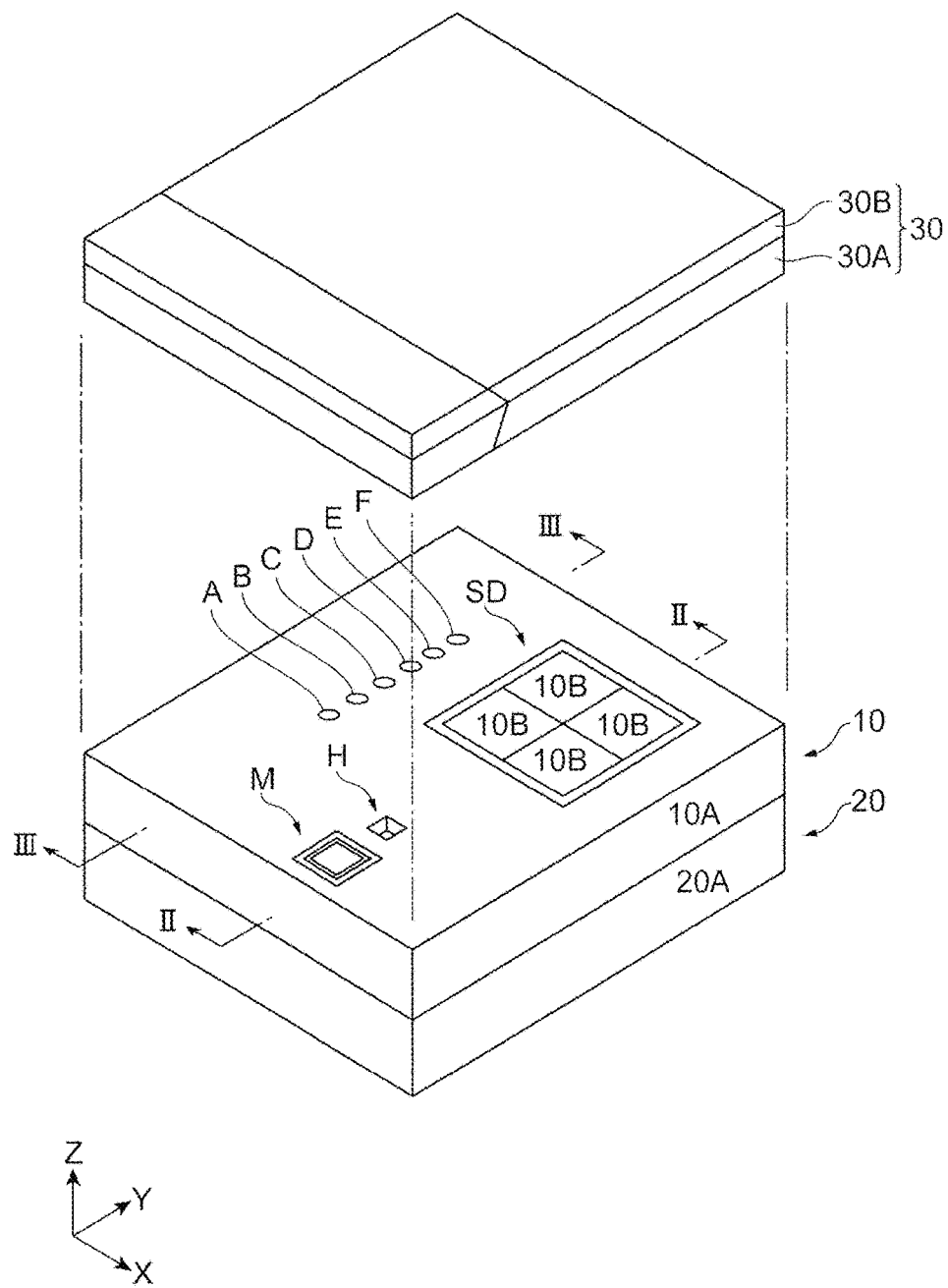
FIG. 1 is a partially exploded perspective view of an optical sensor according to a first embodiment.

Hereinafter, an optical sensor according to an embodiment will be described. The same reference numerals are given to the same components, and detailed description thereof will not be repeated.

Figure 2:
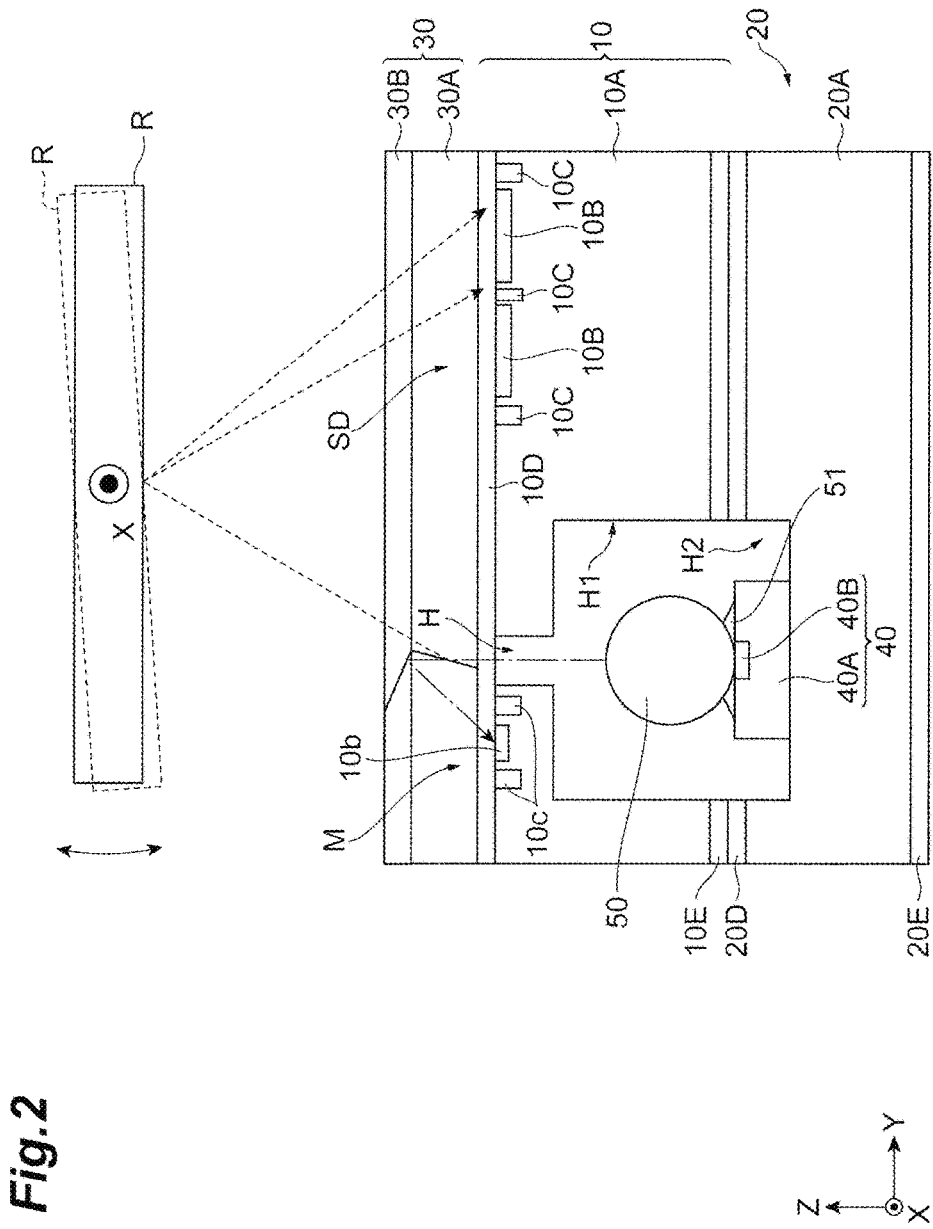
FIG. 2 is a sectional view taken along arrow line II-II of the optical sensor according to the first embodiment and a measurement target.

FIG. 1 is a partially exploded perspective view of an optical sensor according to a first embodiment. FIG. 2 is a sectional view taken along arrow line II-II of the optical sensor according to the first embodiment and a measurement target.

The optical sensor includes a light emitting element 40 (see FIG. 2), a lower substrate 20 on which the light emitting element 40 is disposed, an upper substrate 10, and an optical block 30 provided on the upper substrate 10.

In a three-dimensional rectangular coordinate system, a direction vertical to each substrate is referred to a Z-axial direction, a direction directing toward a division-type photodiode SD from a monitor photodiode M is referred to as a Y-axial direction, and a direction vertical to both of the directions is referred to as an X-axial direction.

The light emitting element 40 is positioned in a space formed between the upper substrate 10 and the lower substrate 20, and for example, is a light emitting diode (LED) that emits visible light having a wavelength of 670 nm, but may employ a laser diode. The light emitting element 40 includes a compound semiconductor substrate 40A and a semiconductor region 40B formed on a front surface side of the compound semiconductor substrate 40A, in which their conductivity types are opposite to each other. That is, one conductivity type is P, and the other conductivity type is N.

A lens (spherical lens) 50 is provided on a light emitting surface of the light emitting element 40. The lens 50 is fixed to the light emitting surface of the light emitting element 40 by an adhesive 51. Light emitted from the light emitting element 40 is collimated by the lens 50, is reflected and deflected by a half mirror in an optical block, and then, is irradiated onto a measurement target R. The measurement target R may rotate around the X-axis and the Y-axis, and light reflected by the measurement target R is incident onto a division-type photodiode SD. Since a light incidence position to the division-type photodiode SD varies according to a rotational angle of the measurement target R, the optical sensor may function as a tilt sensor.

On the upper substrate 10, the division-type photodiode SD and the monitor photodiode M are provided.

First, the division-type photodiode SD will be described. The upper substrate 10 includes a semiconductor substrate main body 10A and plural P-type semiconductor regions 10B formed on a front surface side of the semiconductor substrate main body 10A. In the example of FIG. 2, the semiconductor substrate main body 10A is an N-type. A photodiode having a PN junction is formed between each semiconductor region 10B and the semiconductor substrate main body 10A. In FIG. 1, a four-division photodiode having four photodiodes is shown, but the number of divisions is not limited thereto.

The periphery of the respective semiconductor regions 10B is surrounded by an N-type isolating region 10C. It is preferable that an impurity concentration of the isolating region 10C is higher ($1\times10^{18}$/cm$^3$ or greater) than an impurity concentration of the semiconductor substrate main body 10A.

Next, the monitor photodiode M will be described.

In FIG. 1, the monitor photodiode M is formed at a position different from that of the division-type photodiode SD. Specifically, a light exit hole H is disposed between the monitor photodiode M and the division-type photodiode SD, and a YZ plane is configured to include a line normal to the half mirror and a line normal to a full mirror in the optical block 30. That is, light beams emitted from the light emitting element 40 travel in the same plane (YZ plane), so that a simple structure in which deterioration of detection accuracy due to position deviation of elements does not easily occur is obtained. Light beams can travel only in the YZ plane according to target objects, but in a case where a target object rotates around the X-axis and the Y-axis, the structure in which light beams travel in the YZ plane is not essential.

The monitor photodiode M includes a P-type semiconductor region 10b on the front surface side of the semiconductor substrate main body 10A. Since the semiconductor substrate main body 10A is the N-type, a photodiode having PN junction is formed between the semiconductor region 10b and the semiconductor substrate main body 10A.

The periphery of the semiconductor region 10b is surrounded by an N-type isolating region 10c. An impurity concentration of the isolating region 10c is higher ($1\times10^{18}$/cm$^3$ or greater) than an impurity concentration of the semiconductor substrate main body 10A, and preferably, is the same as the impurity concentration of the isolating region 10C.

The isolating region 10C and the isolating region 10c prevent surplus carriers from entering the semiconductor regions 10B and the semiconductor region 10b, and function as contact regions for providing a substrate electric potential.

On the upper and lower surfaces of the semiconductor substrate main body 10A, an insulating film 10D and an insulating film 10E are respectively formed. Materials of the insulating film 10D and the insulating film 10E are SiO$_2$, for example, but may be other materials such as SiNx or resin.

Furthermore, on the upper and lower surfaces of a semiconductor substrate main body 20A, an insulating film 20D and an insulating film 20E are respectively formed. Materials of the insulating film 20D and the insulating film 20E are SiO$_2$, for example, but may be other materials such as SiNx or resin.

The upper substrate 10 and the lower substrate 20 are bonded together. The bonding method includes a method of heating and pressurizing the upper substrate 10 and the lower substrate 20, a method of interposing an adhesive agent between the upper substrate 10 and the lower substrate 20, a method of connecting an electrode provided on a lower surface of the upper substrate 10 to an electrode provided on an upper surface of the lower substrate 20 through a bump, or the like. In a case where the adhesive agent is used, an interface between the insulating film 10E and the insulating film 20D becomes an adhesive layer.

A recess H1 is formed in the lower surface of the upper substrate 10, a recess H2 is formed in the upper surface of the lower substrate 20. The recess H1 and the recess H2 overlap each other in the Z-axial direction, and thus, a space that accommodates the light emitting element 40 and the condenser lens 50 is formed. That is, since the lower substrate 20 and the upper substrate 10 are respectively provided with the recesses H1 and H2 that form the space that accommodates the light emitting element 40 and the light emitting element 40 is disposed in the recess, size reduction in a substrate thickness direction is achieved.

The optical block 30 is configured to reflect light emitted from the light emitting element 40 toward the measurement target R, and the light reflected by the measurement target R is incident onto the division-type photodiode SD. Further, the upper substrate 10 includes the monitor photodiode M, and the optical block 30 is configured to further reflect the light emitted from the light emitting element 40 toward the monitor photodiode M.

In such an optical sensor, the lower substrate 20, the upper substrate 10, the optical block 30, and the light emitting element 40 are integrated, in which the division-type photodiode SD can detect light that is incident onto the measurement target R through the optical block 30 and is reflected by the measurement target R. Through the integration, it is possible to reduce the size of an entire apparatus. Further, by using the monitor photodiode M, it is possible to stabilize a drive electric current supplied to the light emitting element 40 according to an output of the monitor photodiode M. Since the monitor photodiode M and the division-type photodiode SD are integrated inside the upper substrate 10 and light from the light emitting element 40 is reflected and deflected using the optical block 30, it is possible to reduce the size of the optical sensor.

The optical block 30 includes a half mirror block 30A and a full mirror block 30B that overlaps the half mirror block 30A.

Figure 8:
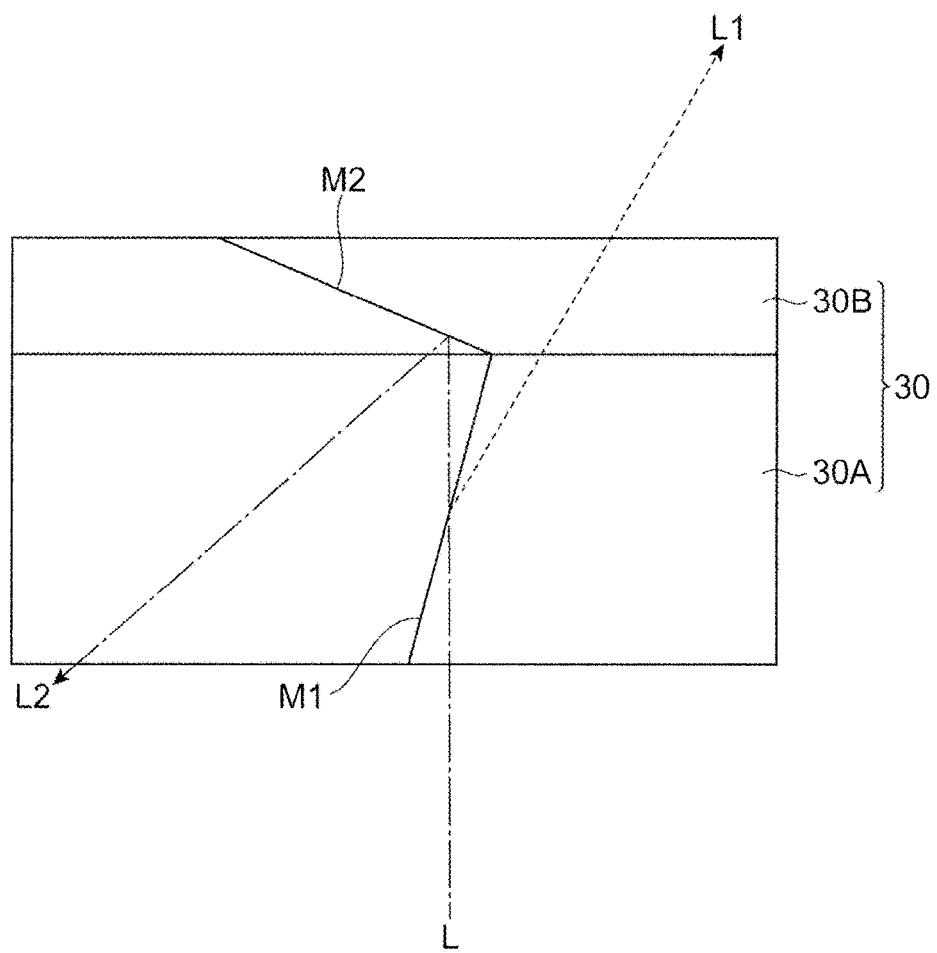
FIG. 8 is a diagram illustrating a configuration of a longitudinal section of an optical block.

In the optical block 30, as shown in FIG. 8, the half mirror block 30A includes a first flat transparent plate, and a half mirror layer M1 that is embedded in the first flat transparent plate along a first inclined plane having, as a line normal thereto, a straight line having an angle inclined with respect to a line normal to a front surface of the first flat transparent plate.

The full mirror block 30B includes a second flat transparent plate, and a full mirror layer M2 that is embedded in the second flat transparent plate along a second inclined plane having, as a line normal thereto, a straight line having an angle inclined with respect to a line normal to a front surface of the second flat transparent plate.

Light L from the light emitting element 40 may be reflected as reflected light L1 toward the measurement target R using the half mirror layer M1, and light that passes through the half mirror layer M1 may be reflected as reflected light L2 toward the monitor photodiode M using the full mirror layer M2 (see FIG. 8).

Figure 3:
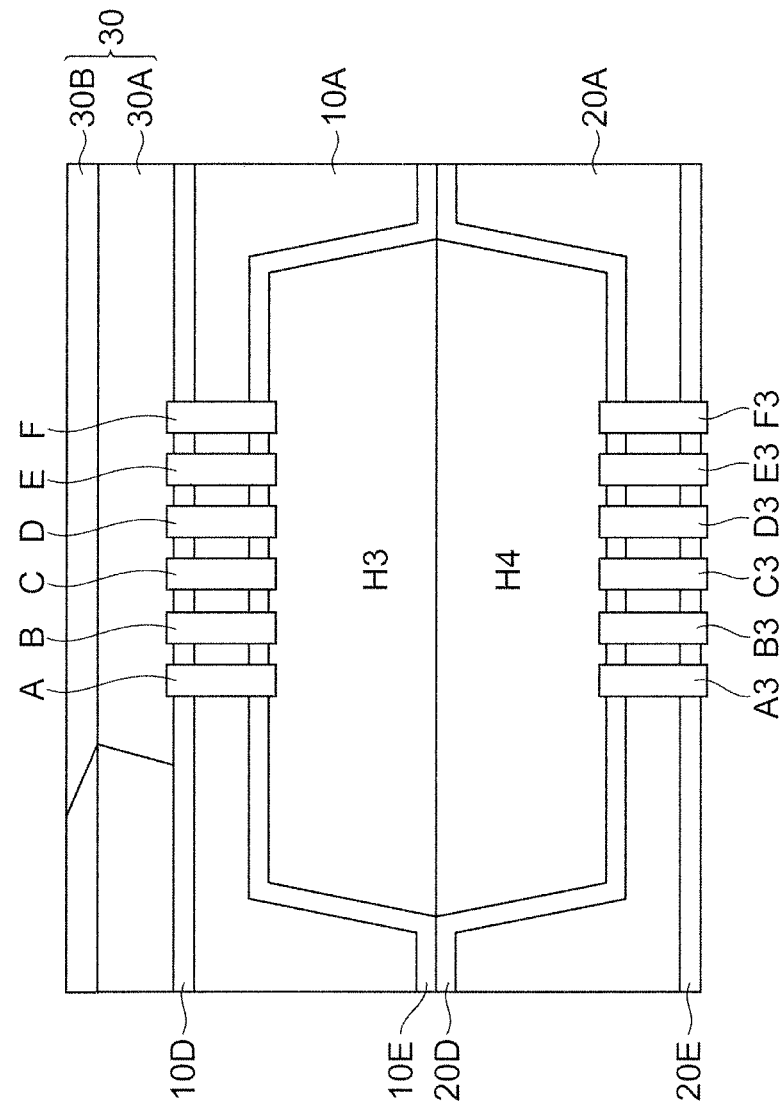
FIG. 3 is a sectional view taken along arrow line II-II of the optical sensor according to the first embodiment.

FIG. 3 is a sectional view taken along arrow line III-II of the optical sensor.

Referring to FIGS. 1 and 3, through-electrodes A, B, C, and C for extracting outputs from the semiconductor regions 10B of the division-type photodiode SD are provided in the upper substrate 10. Further, a through-electrode E for extracting an output from the semiconductor region 10b of the monitor photodiode M is provided in the upper substrate 10. Further, a through-electrode F for providing a substrate electric potential is provided in the upper substrate 10.

The through-electrodes A to F are formed from a bottom surface of a recess H3 formed in the lower surface of the upper substrate 10 to the upper surface of the upper substrate 10, and extend up to the insulating film 10D on the upper surface. The through-electrodes A to F are electrically connected to through-electrodes A3 to F3 of the lower substrate 20 over the insulating films 10E and 20D formed on the upper substrate 10 and the lower substrate 20, respectively. A recess H4 is formed in the upper surface of the lower substrate 20, and the through-electrodes A3 to F3 are formed from a bottom surface of the recess H4 to the lower surface of the lower substrate 20 and extend to be exposed from the insulating film 20E. The through-electrodes A to F may be formed in the upper substrate 10 and the through-electrodes A3 to F3 may be formed in the lower substrate 20, respectively, without using the recess H3 in the upper substrate and without using the recess H4 in the lower substrate 20.

An adhesive layer is interposed between the insulating film 10D on the upper substrate 10 and the optical block 30.

Figure 4:
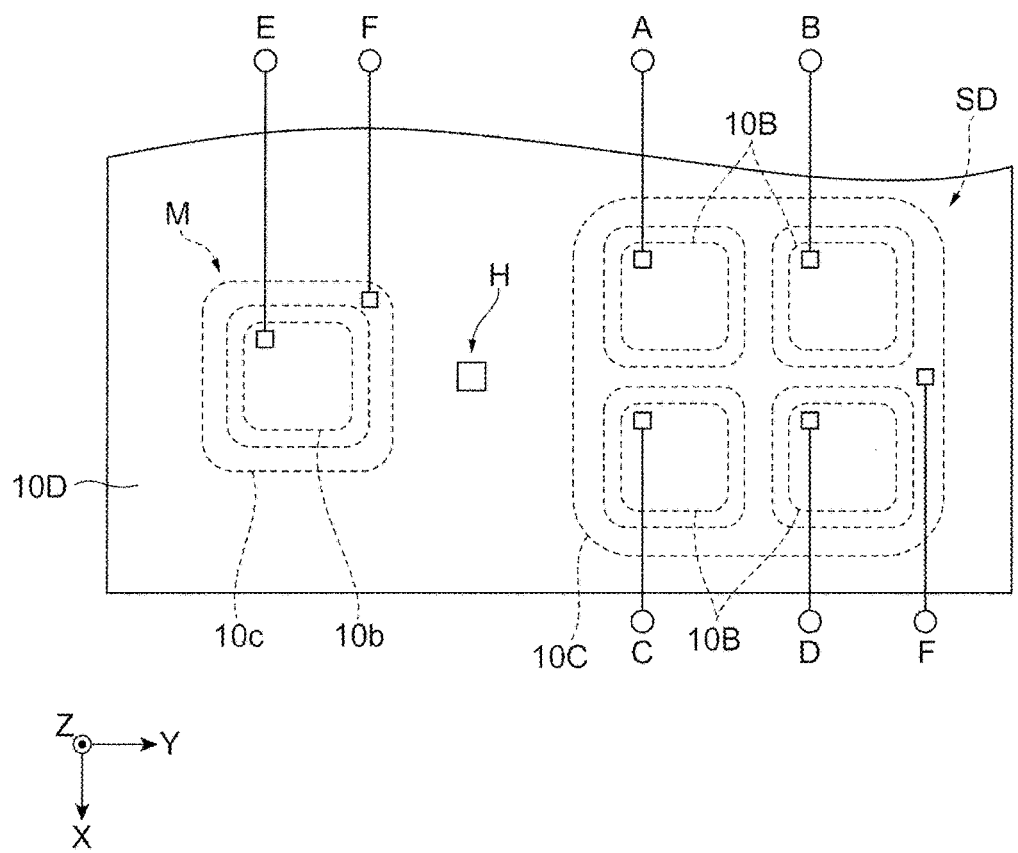
FIG. 4 is a plan view of a partial region of an optical sensor.

FIG. 4 is a plan view of a partial region of the optical sensor.

Contact electrodes that are electrically connected to the semiconductor regions 10B, the semiconductor region 10b, the isolated region 10C, and the isolated region 10c are exposed on the insulating film 10D of the upper substrate 10, respectively, and the respective contact electrodes are connected to the through-electrodes A to F.

Figure 5:
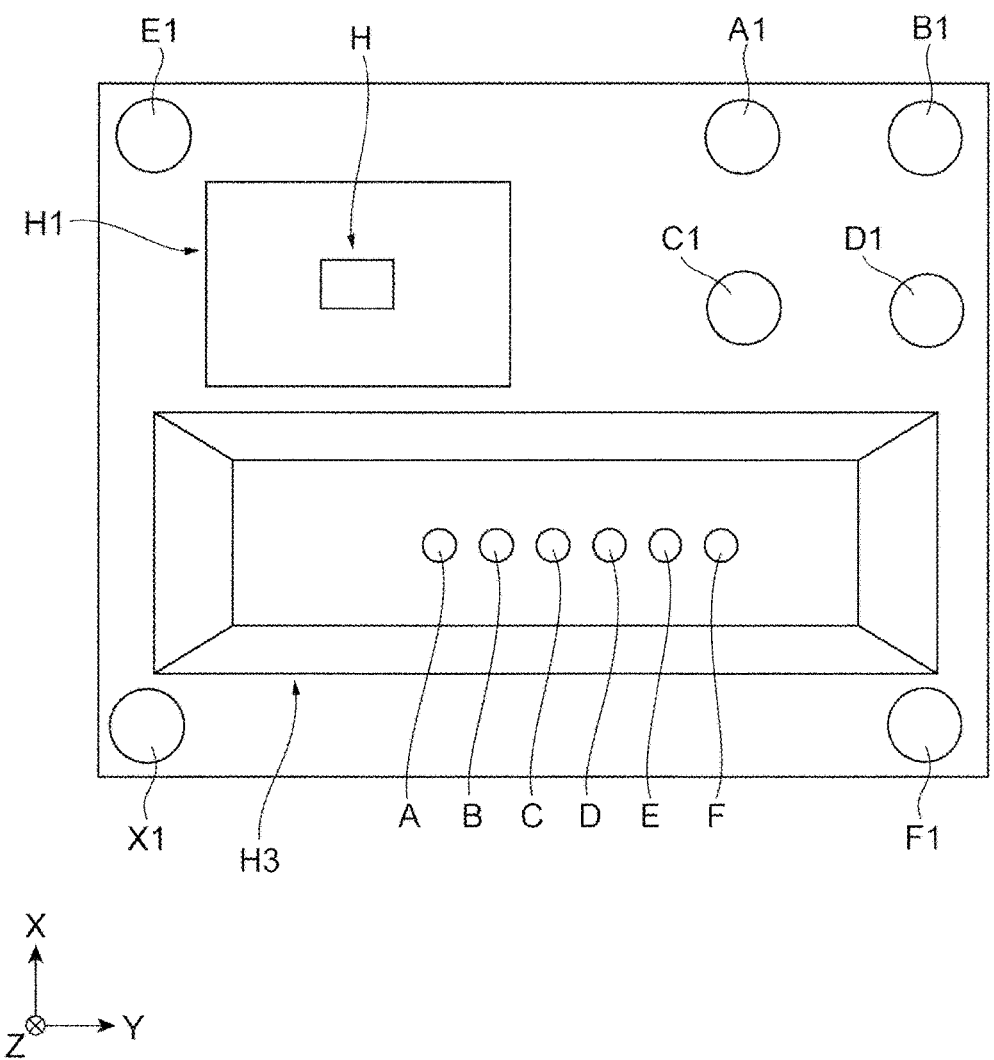
FIG. 5 is a bottom view of an upper substrate.

FIG. 5 is a bottom view of the upper substrate 10.

The through-electrodes A to F are electrically connected to electrode pads A1 to F1 provided on a lower surface of the insulating film 10E over the insulating film 10E, respectively. A dummy electrode pad X1 for uniformly retaining a gap between substrates may be provided on the lower surface of the insulating film 10E.

Figure 6:
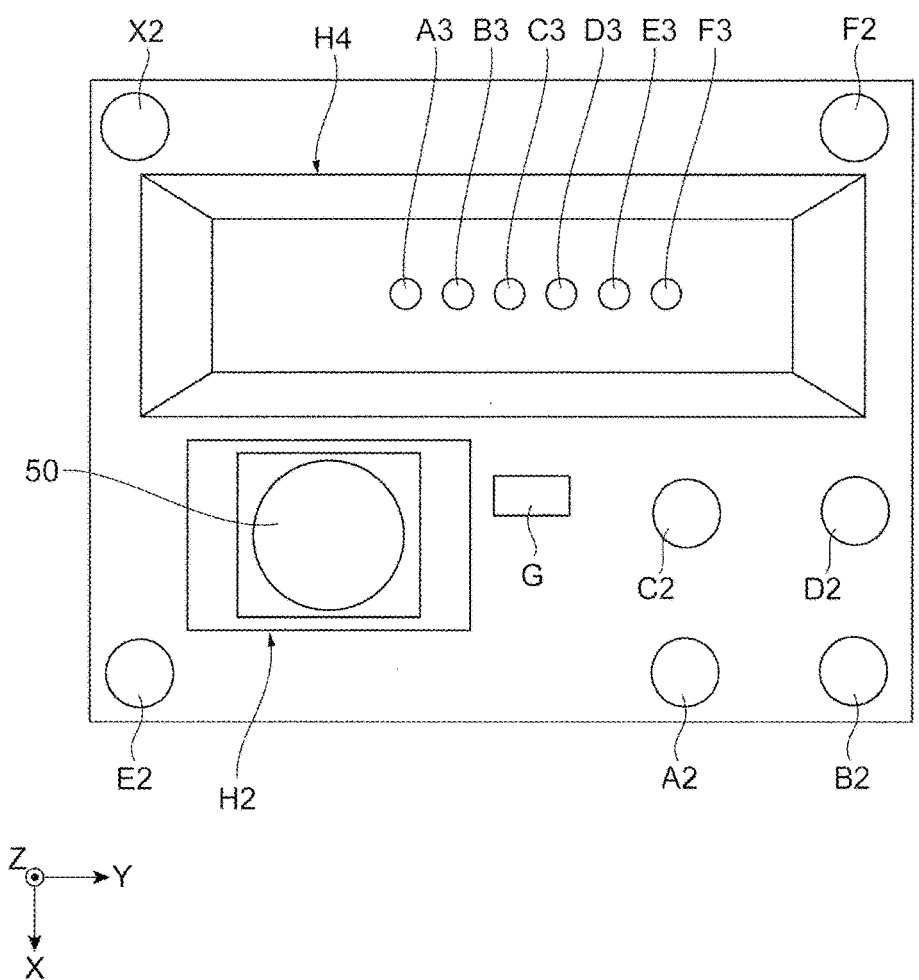
FIG. 6 is a bottom view of a lower substrate.

FIG. 6 is a bottom view of the lower substrate 20.

The electrode pads A1 to F1, and X1 are electrically connected to electrode pads A2 to F2, and X2 which are provided to face the electrode pads A1 to F1, and X1 on an upper surface of the insulating film 20D, respectively. Solder bumps may be used for the connection. On the upper surface of the insulating film 20D, an electrode pad G for supplying a drive electric current to one terminal of the light emitting element 40 is provided, and the electrode pad G is electrically connected to a through-electrode G3. A substrate electric potential of the lower substrate 20 is given to the other terminal of the light emitting element 40 from the through-electrode F3.

Figure 7:
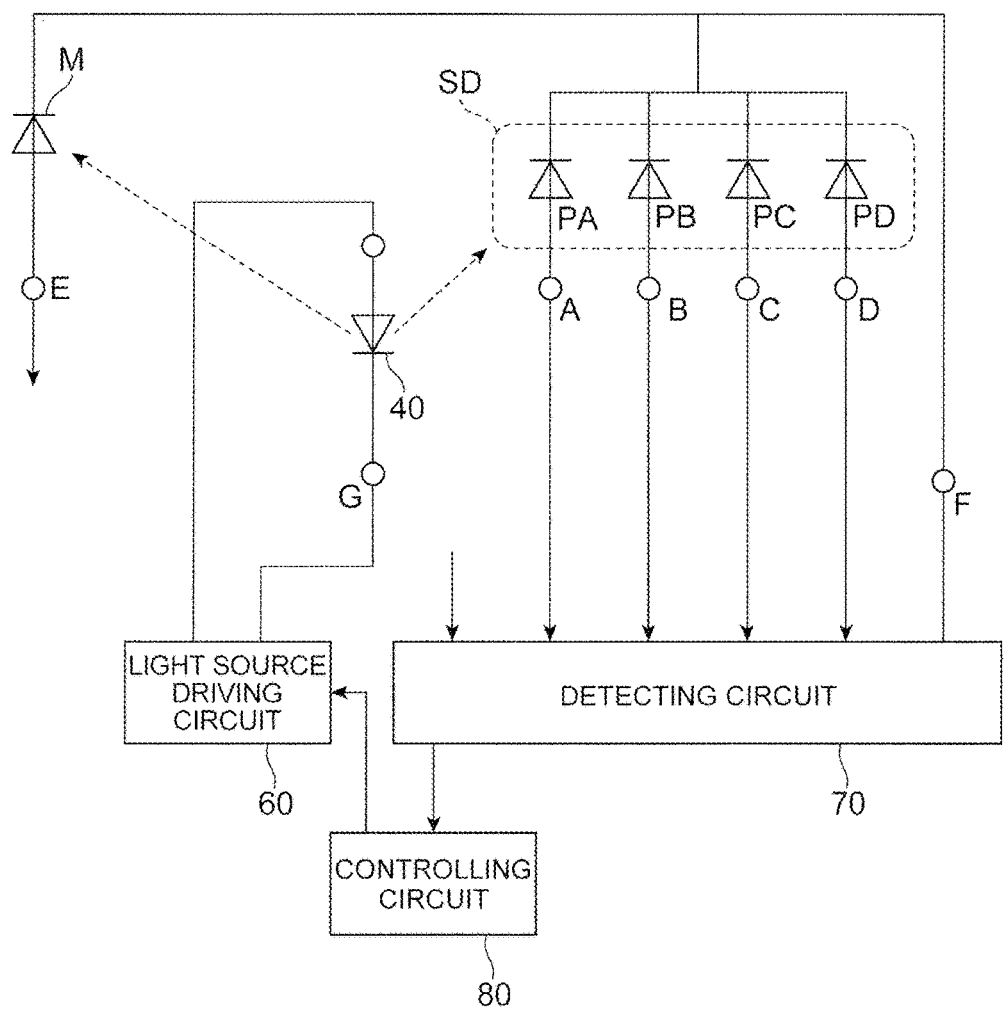
FIG. 7 is a circuit diagram of the optical sensor.

FIG. 7 is a circuit diagram of an optical sensor.

The division-type photodiode SD includes four photodiodes PA, PB, PC, and PD, and outputs thereof are input to a detecting circuit 70 through through-electrodes A, B, C, and D. The detecting circuit 70 converts an input signal into a voltage and amplifies the voltage as necessary, or converts the input signal into a digital value and inputs a detection value to a controlling circuit 80. The controlling circuit 80 calculates a rotational angle of the measurement target R based on the input detection value, and outputs the result to an external device.

A monitoring signal from the monitor photodiode M is also input to the detecting circuit 70 through the through-electrode E. The detecting circuit 70 converts an input signal into a voltage and amplifies the voltage as necessary, or converts the input signal into a digital value and inputs a detection value to the controlling circuit 80. The controlling circuit 80 controls the size of the drive electric current supplied to the light emitting element 40 from the light source driving circuit 60 so that a detection value of the input monitoring signal becomes constant. That is, the controlling circuit 80 performs a process of decreasing the drive electric current in a case where the monitoring signal is equal to or greater than a reference value and increasing the drive electric current in a case where the monitoring signal is smaller than the reference value.

Figure 9:
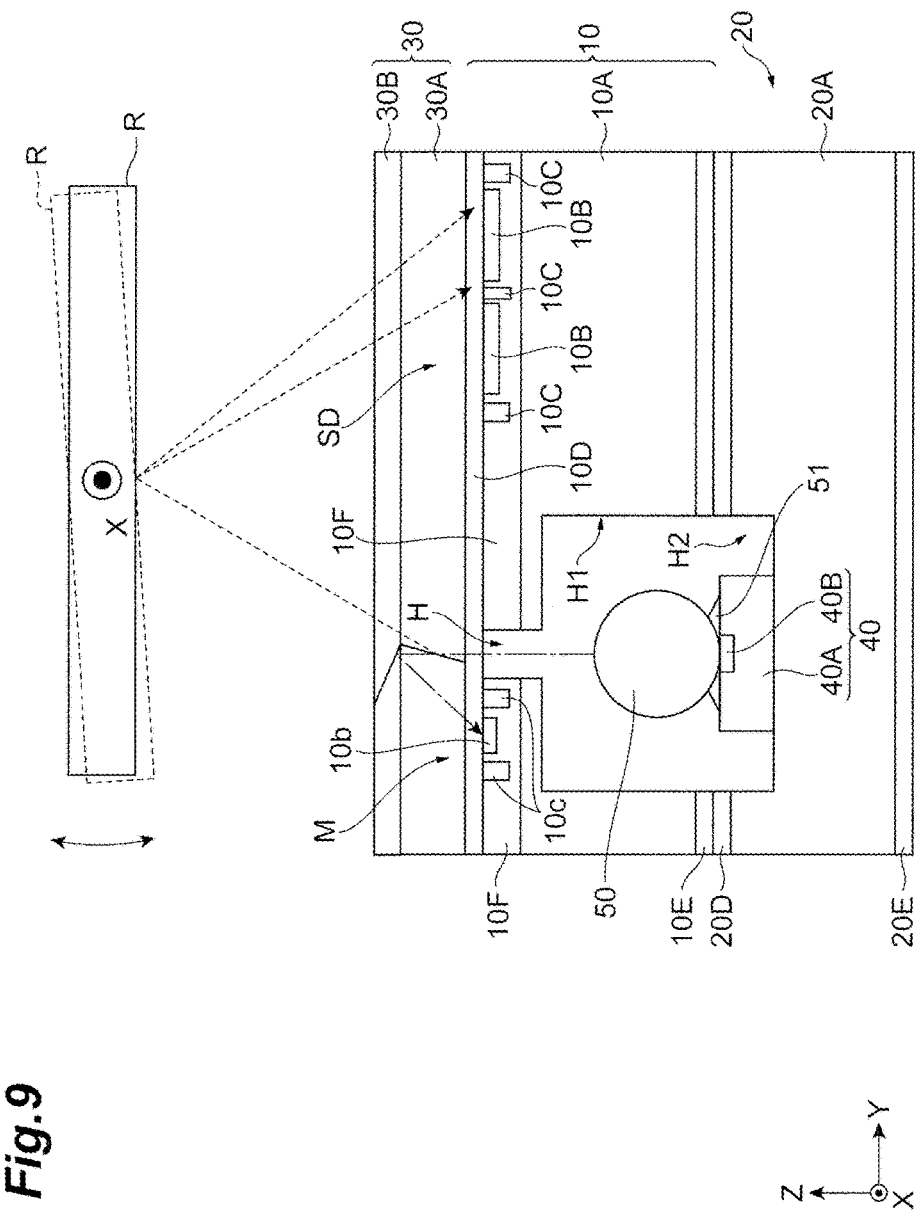
FIG. 9 is a longitudinal sectional view of an optical sensor according to a second embodiment and a measurement target.

FIG. 9 is a longitudinal sectional view of an optical sensor according to a second embodiment and a measurement target.

In this embodiment, the upper substrate 10 includes an N-type semiconductor substrate main body 10A having an impurity concentration of $1 \times 10^{18}/cm^3$ or greater, an N-type semiconductor region 10F which is formed on a front surface of the semiconductor substrate main body and having an impurity concentration less than $1 \times 10^{18}/cm^3$ (for example, $4 \times 10^{12}/cm^3$, in which a preferable range is $1 \times 10^{11}/cm^3$ or greater and $1 \times 10^{16}/cm^3$ or less), and plural P-type semiconductor regions 10B formed in the N-type semiconductor region 10F. A division-type photodiode SD is configured by the N-type semiconductor region 10F and the plural P-type semiconductor regions 10B, and a monitor photodiode M is configured by the N-type semiconductor region 10F and plural P-type semiconductor regions 10b. Other configurations are the same as in the first embodiment. The N-type semiconductor region 10F is an epitaxial layer.

As in this example, in a case where the semiconductor substrate main body 10A has a high impurity concentration ($1 \times 10^{18}/cm^3$ or greater), it is possible to block light incident onto the division-type photodiode SD positioned on the front surface from a substrate rear surface side, and thus, it is possible to perform accurate measurement.

Figure 10:
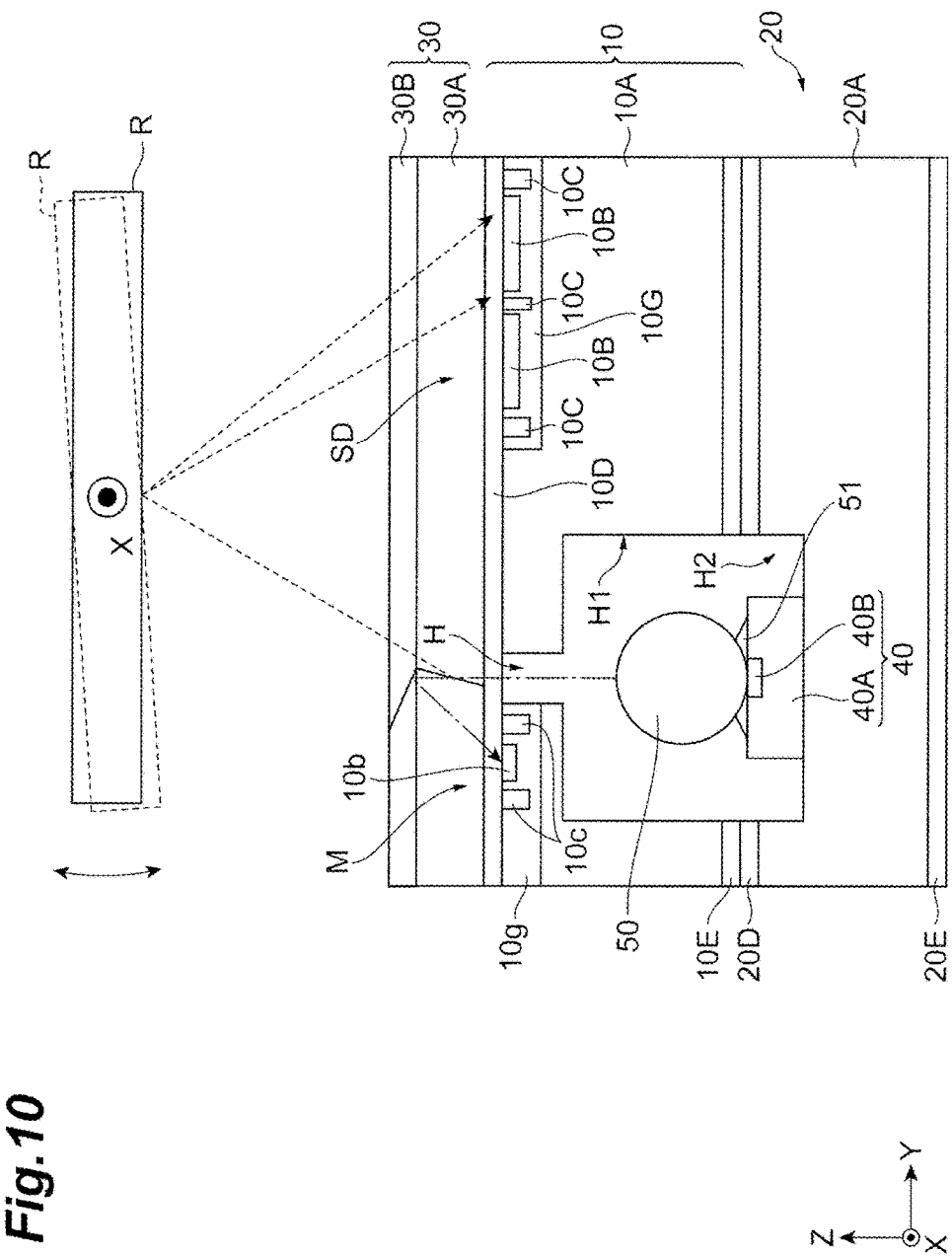
FIG. 10 is a longitudinal sectional view of an optical sensor according to a third embodiment and a measurement target.

FIG. 10 is a longitudinal sectional view of an optical sensor according to a third embodiment and a measurement target.

In this embodiment, an upper substrate 10 includes a P-type semiconductor substrate main body 10A, N-type semiconductor regions 10G and 10g formed on a front surface of the semiconductor substrate main body 10A, and plural P-type semiconductor regions 10I and a P-type semiconductor region 10b, which are formed in the N-type semiconductor regions 10G and 10g.

A division-type photodiode SD is configured by the N-type semiconductor region 10G and the plural P-type semiconductor regions 10B, and a monitor photodiode M is configured by the N-type semiconductor region 10g and the plural P-type semiconductor regions 10b. Other configurations are the same as in the first embodiment.

Even with such a structure, the optical sensor performs its function, but in a case where the P-type semiconductor substrate main body 10A is used, a PN junction is formed between the P-type semiconductor substrate main body 10A and each N-type semiconductor region 10G. Accordingly, the PN junction may be used as a monitor photodiode. In this case, an output of the monitor photodiode may be extracted from an electrode which is electrically connected to the semiconductor substrate main body 10A and each N-type semiconductor region 10G. In this case, the monitor photodiode may be not provided.

Figure 11:
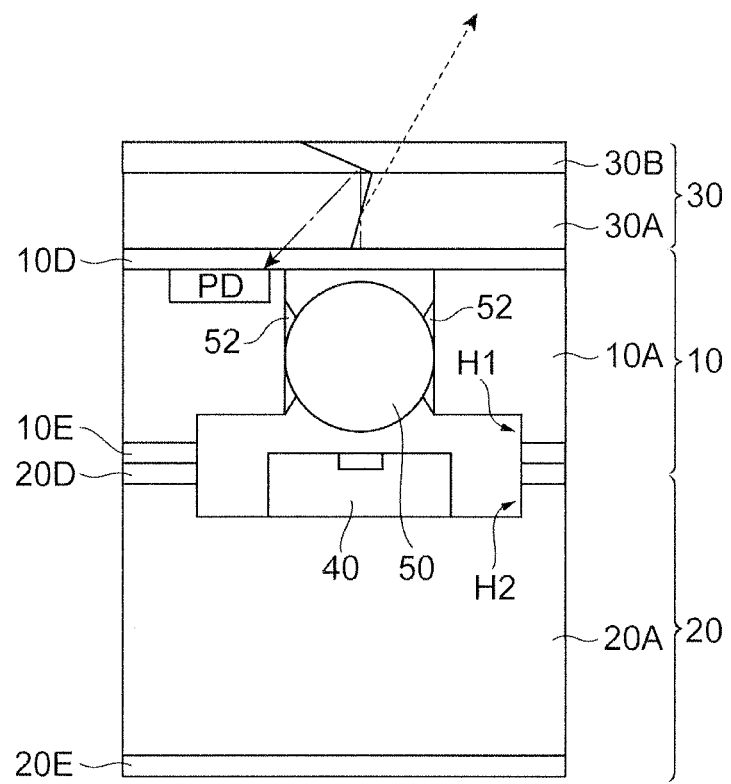
FIG. 11 is a longitudinal sectional view of an optical sensor according to a fourth embodiment and a measurement target.

FIG. 11 is a longitudinal sectional view of an optical sensor according to a fourth embodiment and a measurement target.

In the above-described example, a configuration in which the condenser lens 50 is fixed to the light emitting element 40, but a configuration in which the diameter of the light exit hole H formed through the upper substrate 10 is enlarged and the condenser lens 50 is fixed to an inner surface thereof may be used. An adhesive 52 may be used for the fixing.

Figure 12:
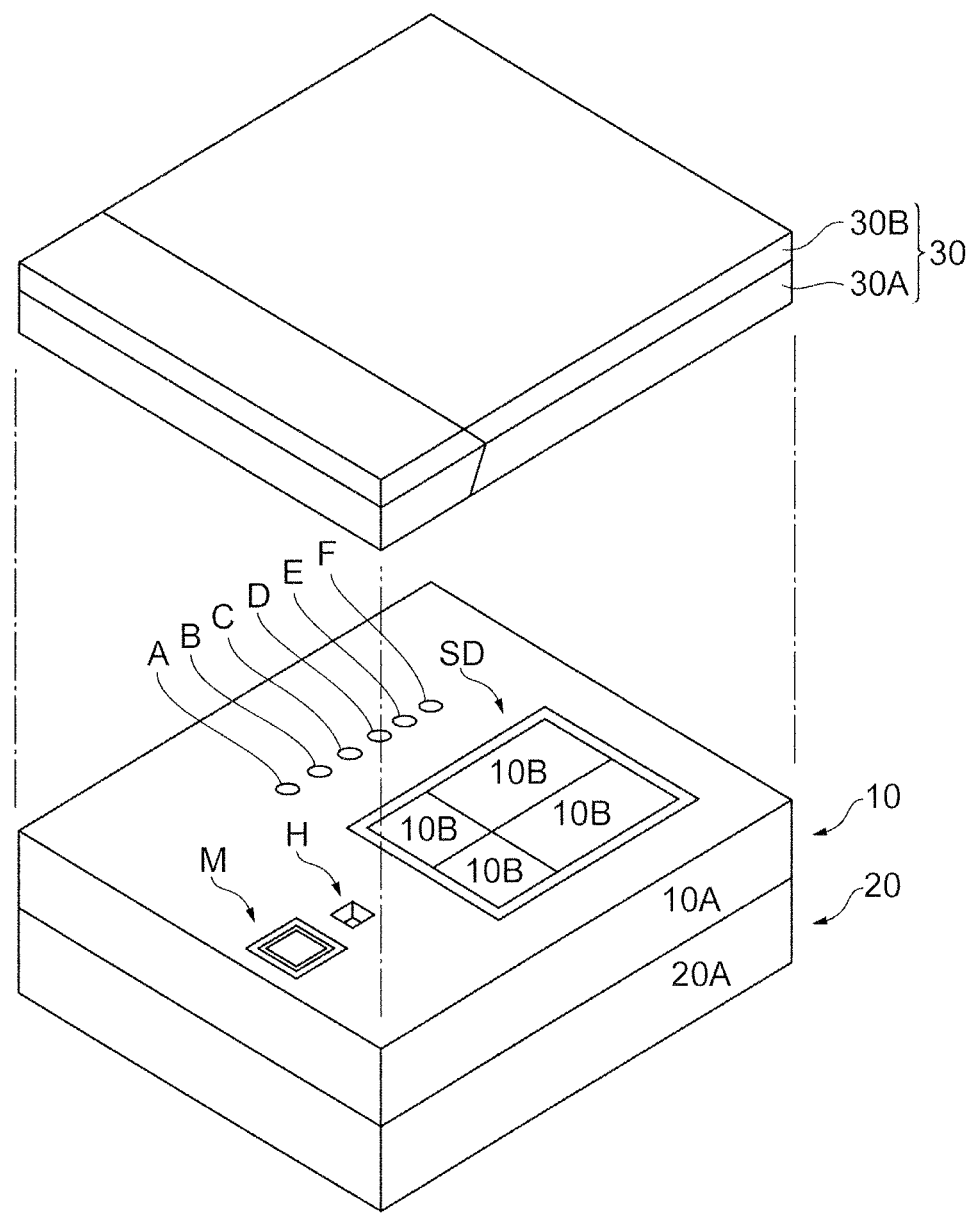
FIG. 12 is a partially exploded perspective view of an optical sensor according to a modification example.

FIG. 12 is a partially exploded perspective view of an optical sensor according to a modification example.

In the above-described example, the sizes of the semiconductor regions 10B that form a photosensitive region of the four-division type photodiode are the same, but the sizes may be different from each other. That is, the area of the semiconductor region 10B on a side distant from the light exit hole H may be set to be larger than the area of the semiconductor region 10B on a side close to the light exit hole H. The rotational angle of the measurement target corresponds to a ratio of outputs from the respective semiconductor regions 10B of the division-type photodiode SD. Here, by setting the areas as in this modification example, it is possible to improve linearity of a four-division type photodiode output value of the four-division type photodiode with respect to an angle of a measurement target, to thereby reduce a load of a controlling circuit.

Figure 13:
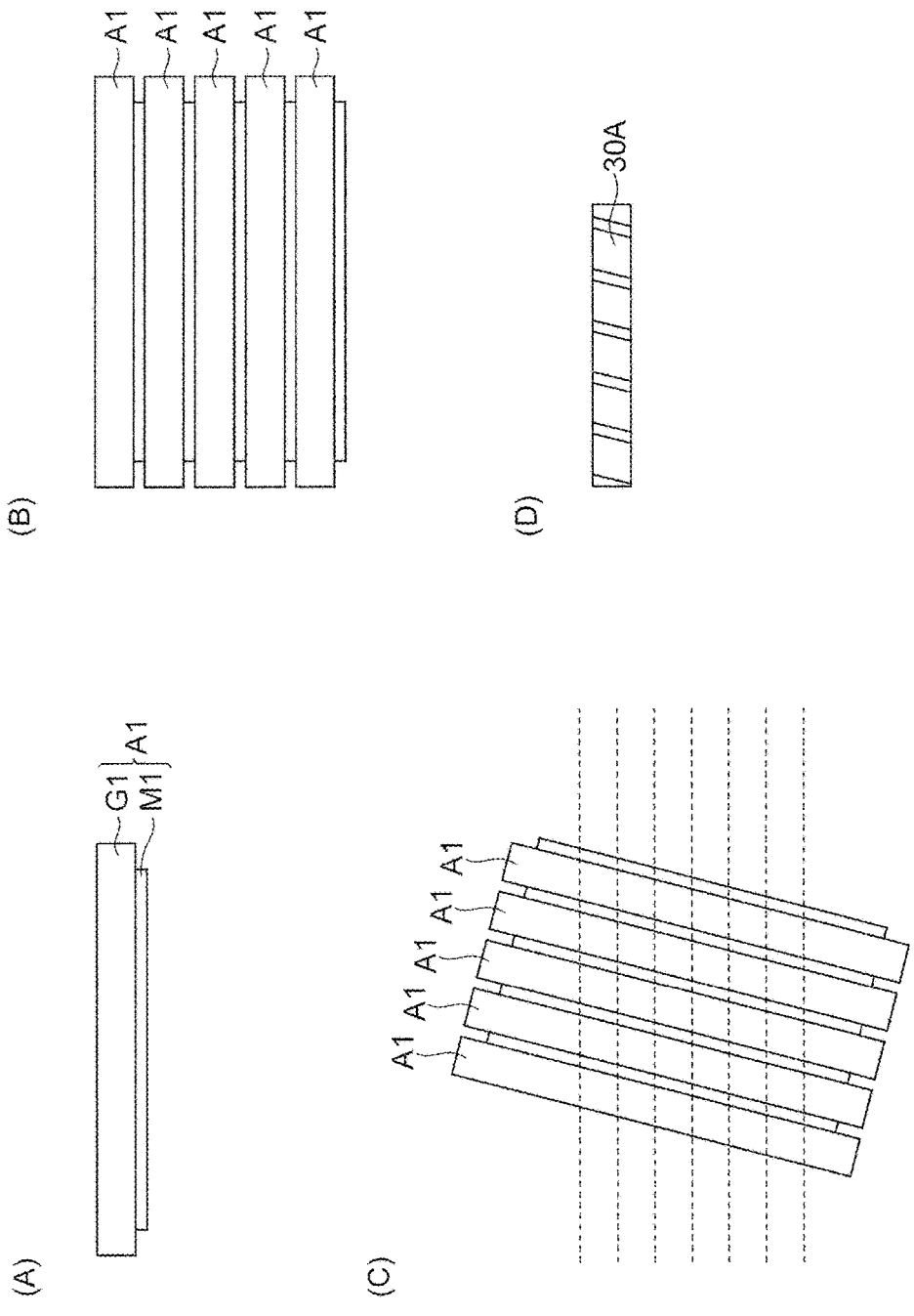
FIGS. 13A to 13D are diagrams illustrating a manufacturing method of a half mirror block.

FIG. 13 is diagrams illustrating a manufacturing method of the half mirror block 30A.

First, a half mirror layer M1 is formed on a transparent substrate G1 to manufacture a unit mirror structure A1 (A). Then, the unit mirror structures A1 are layered to form a layered body (B). Then, the layered body is cut at a predetermined angle (C). Thus, the half mirror block 30A can be manufactured (D). The half mirror block 30A includes a first flat transparent plate made of a material of a transparent substrate G1, and the half mirror layer M1.

Figure 14:
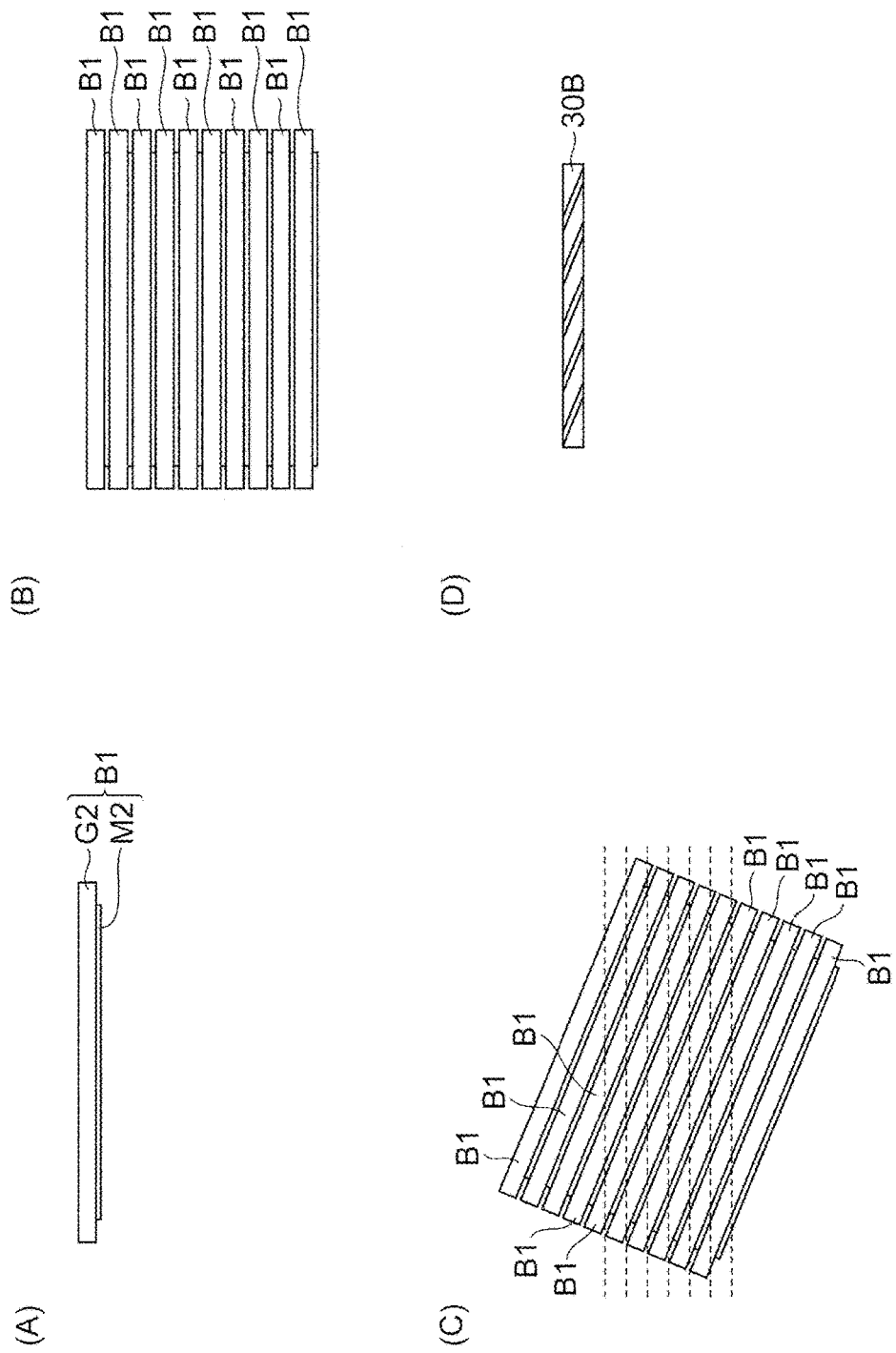
FIGS. 14A to 14D are diagrams illustrating a manufacturing method of a full mirror block.

FIG. 14 is diagrams illustrating a manufacturing method of the full mirror block 30B.

First, a full mirror layer M2 is formed on a transparent substrate G2 to manufacture a unit mirror structure B1 (A). Then, the unit mirror structures B1 are layered to form a layered body (B). Then, the layered body is cut at a predetermined angle (C). Thus, the full mirror block 30B can be manufactured (D). The full mirror block 30B includes a first flat transparent plate made of a material of a transparent substrate G2 and the full mirror layer M2.

As the materials of the above-described transparent substrates G1 and G2, $SiO_2$ may be used, but other transparent materials may be used. Further, as the material of the half mirror layer M1, a metal film made of aluminum (Al), chrome (Cr), or the like, a dielectric multilayer film, or the like may be used (in which the dielectric multilayer film is a multilayer film made of at least two types of dielectrics among titanium oxide ($TiO_2$), aluminum oxide ($Al_2O_3$), silicon oxide ($SiO_2$), or magnesium fluoride ($MgF_2$), which form materials of dielectric films). Further, as the material of the full mirror layer M2, a metal film made of aluminum (Al), silver (Ag), or the like, a dielectric multilayer film, or the like may be used (in which the dielectric multilayer film is a multilayer film made of at least two types of dielectrics among titanium oxide ($TiO_2$), aluminum oxide ($Al_2O_3$), silicon oxide ($SiO_2$), or magnesium fluoride ($MgF_2$), which form materials of dielectric films). These layers may be formed on the transparent substrates using a sputtering method, a deposition method, or a plating method.

Figure 15:
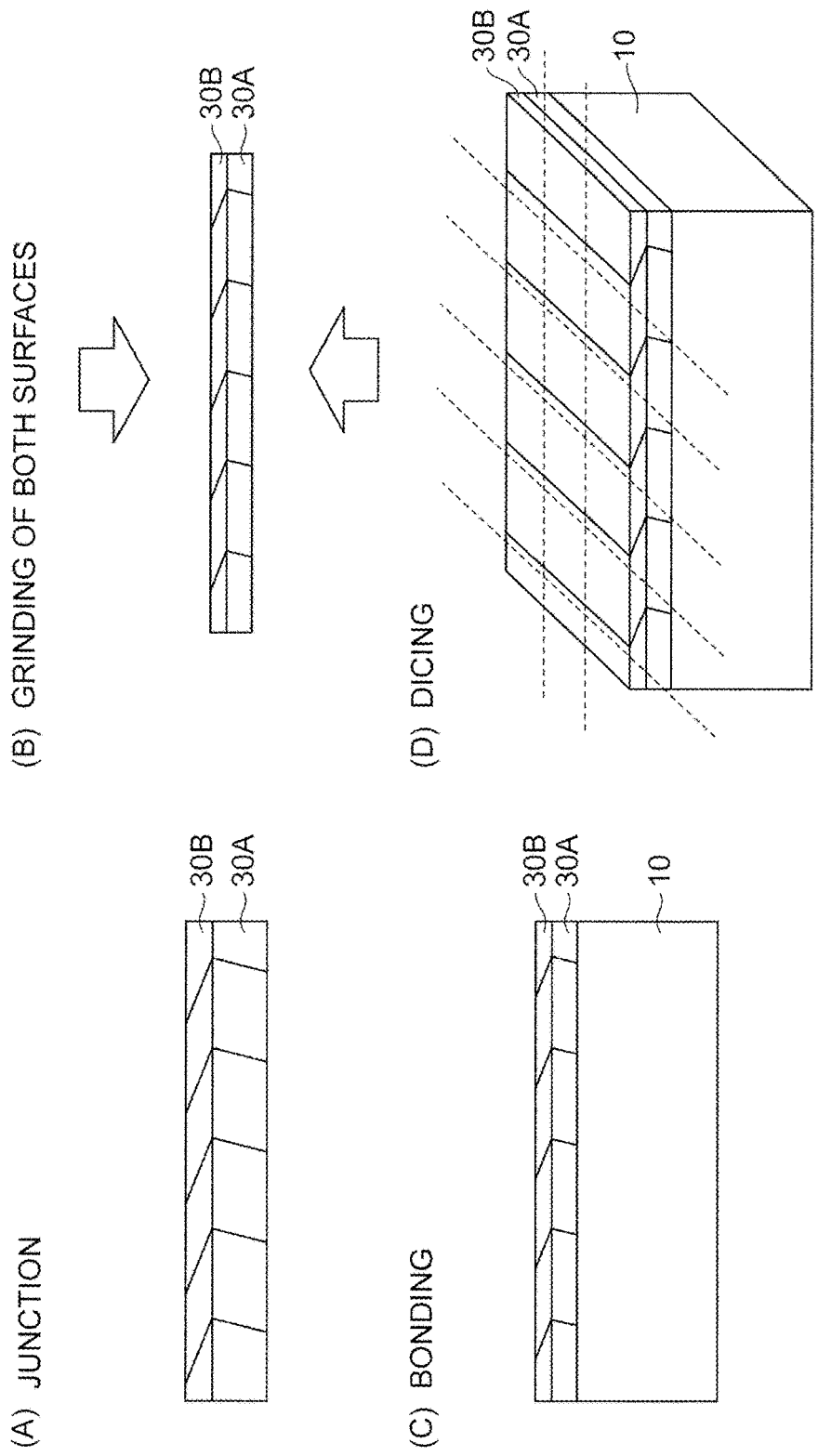
FIGS. 15A to 15D are diagrams illustrating a manufacturing method of an optical sensor.

FIG. 15 is diagrams illustrating a manufacturing method of an optical sensor.

The half mirror block 30A and the full mirror block 30B formed as described above are bonded for junction (A). The junction may be performed using thermo-compression bonding, but may be performed using an adhesive. Then, both surfaces of the optical block 30 obtained by the junction are grinded (B). Thereafter, the optical block 30 is bonded onto the upper substrate 10 (C). The bonding may be performed using thermo-compression bonding, but may be performed using an adhesive. Further, in the process (C), an ordinary temperature junction process or the like other than the above-described method may be used. Then, the lower substrate 20 in which a lens and a light emitting element are provided is bonded onto the upper substrate 10 of a layered body obtained in the process (C) (D). A layered body obtained in the process (D) is diced to be separated into individual elements (E). Thus, the above-described optical sensor is formed. Instead, a process of dicing the layered body to be separated after the process (C) and bonding the lower substrate 20 in which the lens and the light emitting element are provided onto the upper substrate 10 of each of the separated elements may be used.

Figure 16:
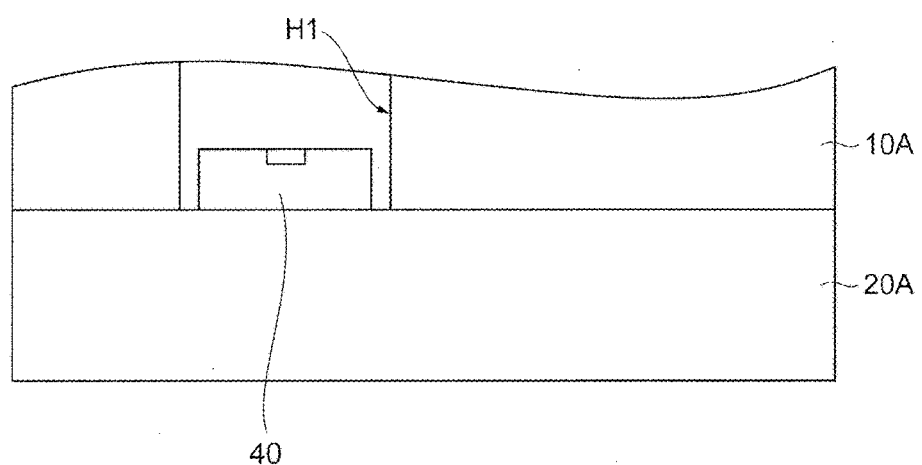
FIG. 16 is a diagram illustrating a modification example of a modification example of a recess position.

FIG. 16 is a diagram illustrating a modification example of a recess position.

Even in any example described above, the light emitting element 40 is only disposed in the recess H1, so that the front surface of the semiconductor substrate main body 20A of the lower substrate can be flattened. Description about other elements will not be repeated.

Figure 17:
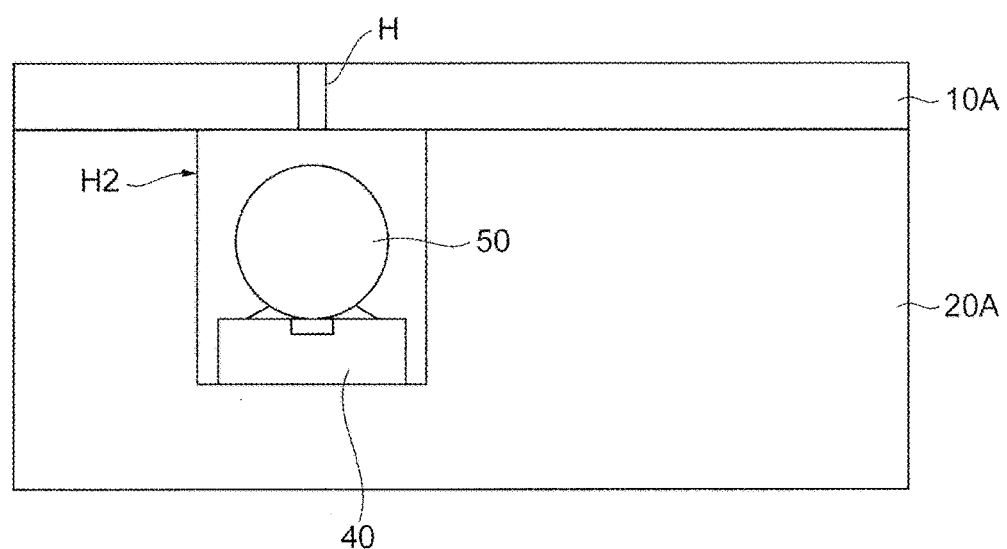
FIG. 17 is a diagram illustrating a modification example of a recess position.

FIG. 17 is a diagram illustrating a modification example of a recess position.

Even in any example described above, the light emitting element 40 is only disposed in the recess H2, so that the lower surface of the semiconductor substrate main body 10A of the upper substrate can be flattened. Description about other elements will not be repeated.

Further, the above-described optical sensor may detect a rotational angle (inclination angle) of a measurement target, but may detect other physical amounts (position or the like) according to uses.

Instead of the above-described division-type photodiode, a position sensitive detector (PSD) may be used. The PSD is a spot light position sensor using a surface resistance of a photodiode. Since the PSD is a non-division type different from a CCD or the like, a continuous electric signal (X or Y coordinate) is obtained, and is thus excellent in position resolution and responsiveness. Light emitted from a light emitting element and collimated by the lens 50 and the light exit hole H in the substrate 10 is reflected by the half mirror 30A in the optical block 30, is reflected by the measurement target R, and is irradiated onto the (two-dimensional) PSD. An irradiation position on the PSD is calculated using a photo-electric current value extracted by each output electrode of the PSD, and an angle of the measurement target R is calculated. Hereinafter, its structure will be described.

Figure 18:
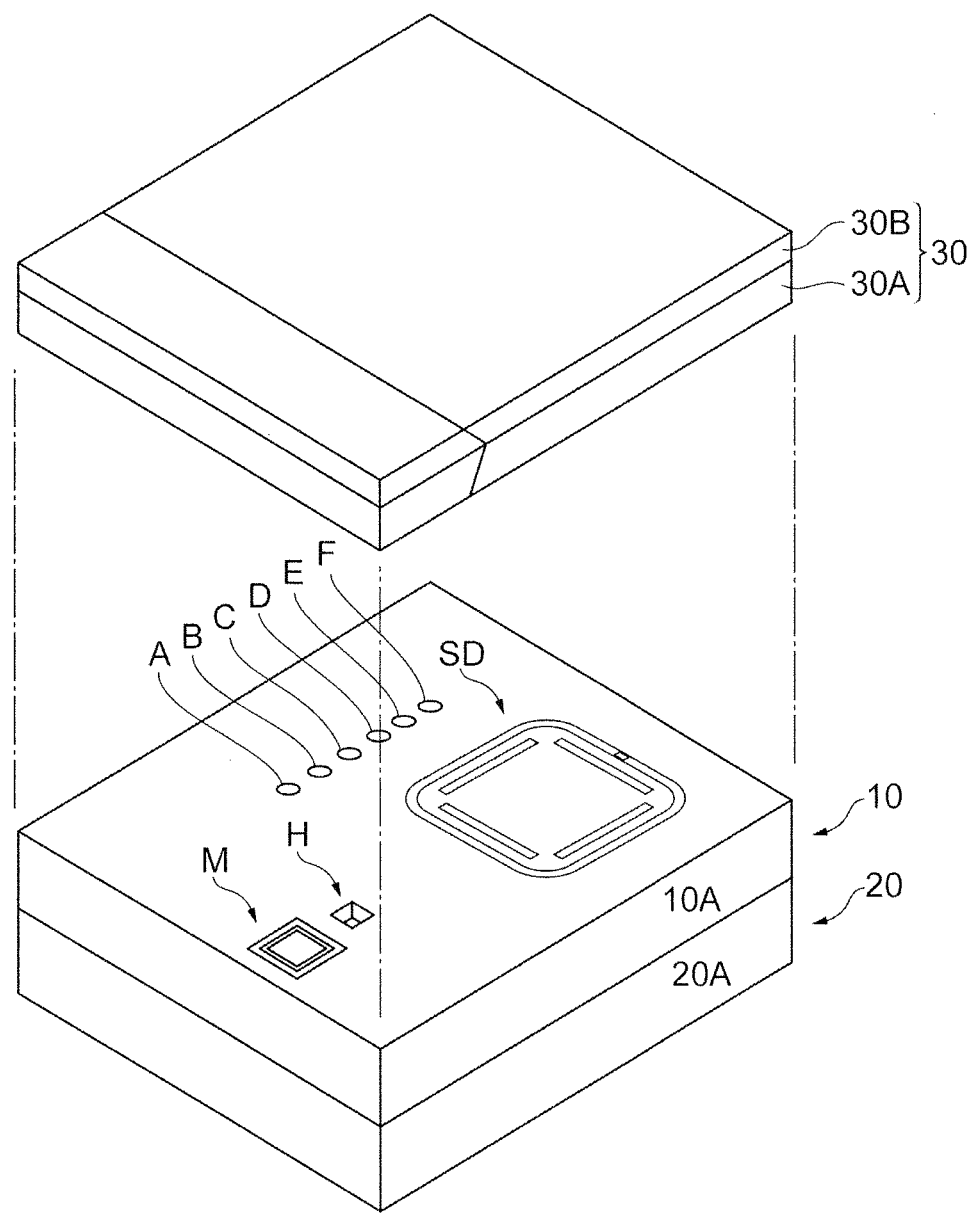
FIG. 18 is a perspective view of an optical sensor using a PSD instead of a division-type photodiode.

FIG. 18 is a perspective view of an optical sensor using a PSD instead of a division-type photodiode. This optical sensor is different from the sensor illustrated in FIG. 1 only in that a PSD is disposed at the position of the division-type photodiode, and other configurations are the same as in FIG. 1.

Figure 19:
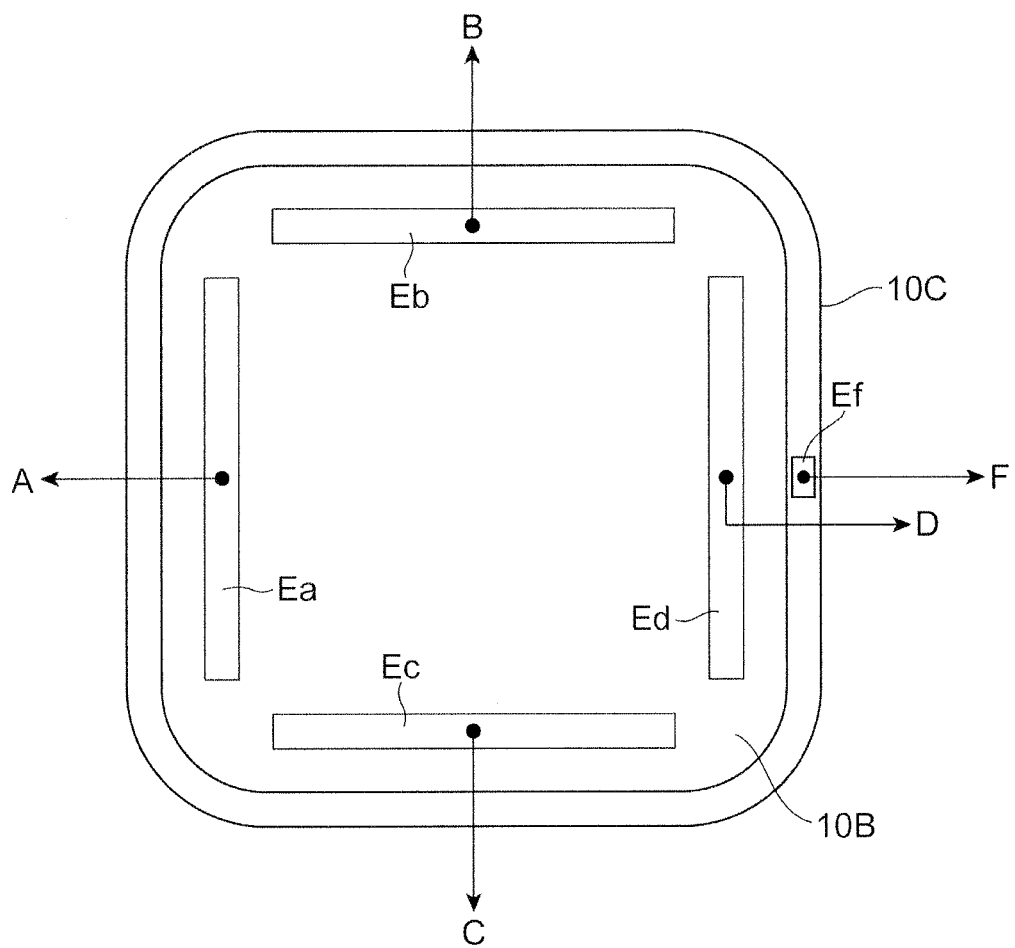
FIG. 19 is a plan view of the PSD.

FIG. 19 is a plan view of a PSD, in which two sets of pairs of electrodes (Ea and Ed) and (Eb and Ec) that face each other are disposed on a front surface of the semiconductor region 10B of an approximately rectangular shape. In the PSD, since a resistance value from an incidence position to an electrode varies according to a spot position of incident light, if a ratio of electric currents output from electrodes which face each other is calculated, a spot light incidence position, that is, a position of a measurement target is determined.

Figure 20:
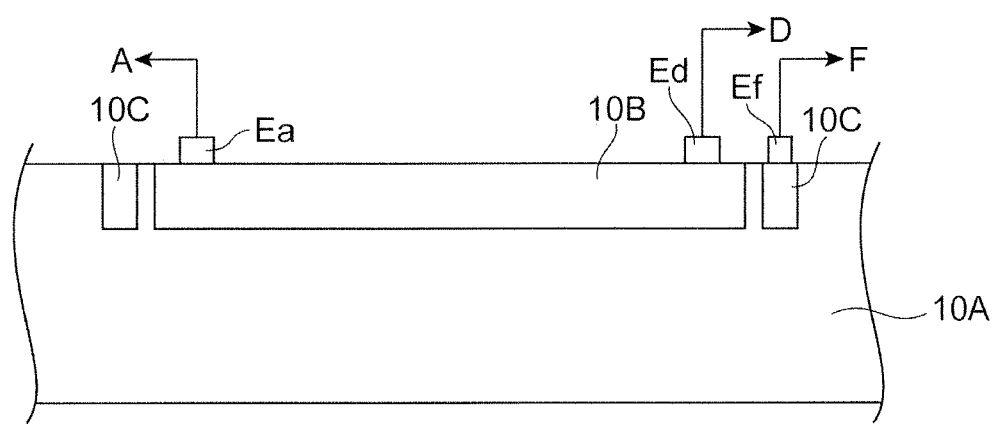
FIG. 20 is a diagram illustrating a configuration of a longitudinal sectional view of the PSD shown in FIG. 19.

FIG. 20 is a diagram illustrating a configuration of a longitudinal sectional view of the PSD shown in FIG. 19.

The PSD forms a diode in a substrate thickness direction, and the diode is formed between the semiconductor region 10B and the semiconductor substrate main body 10A. The semiconductor region 10B is a P-type, for example, and the semiconductor substrate main body 10A is an N-type, for example, but the structure shown in FIG. 9 or FIG. 10 may be used. The semiconductor substrate main body 10A is connected to a fixed electric potential such as a ground through the isolating region 10C and an electrode Ef formed thereon. A conductivity type of the isolating region 10C is an N-type, for example, but may be the same as the conductivity type of the semiconductor substrate main body 10A, and a substrate electric potential may be provided thereto.

The electrodes Ea, Eb, Ec, Ed, and Ef may be connected to the above-described through-electrodes A, B, C, D, and F, respectively. Further, the isolating region 10C may be set as a cathode and the semiconductor region 10B may be set as an anode, but the setting may be oppositely performed. The configuration of the division-type photodiode may be applied to the PSD. In FIG. 20, an example in which the depth of the isolating region 10C is the same as the depth of the semiconductor region 10B is shown, but it is preferable that the depth of the isolating region 10C that forms a peripheral region of the PSD is deeper than that of the semiconductor region 10B.

Further, as illustrated in FIG. 9, the semiconductor region 10F may be formed on the front surface of the semiconductor substrate main body 10A, and a single semiconductor region 10B which becomes a light detecting region of the PSD may be formed therein. A sectional configuration of a semiconductor is the same as a structure of the half of the division-type photodiode SD in FIG. 9 in a lateral direction.

As described above, in the above-described embodiments, a position detection type light detecting element formed by a division-type photodiode or a PSD is provided, which may be applied to a tilt sensor.

Further, the above-described semiconductor substrate main body is formed of Si, but may be formed of other materials. Further, the N-type (first conductivity type) and the P-type (second conductivity type) may be exchanged.

As described above, the optical sensor includes the light emitting element 40; the lower substrate 20 on which the light emitting element 40 is provided; the upper substrate 10 provided so that the light emitting element 40 is positioned between the upper substrate 10 and the lower substrate 20; and the optical block 30 provided on the upper substrate 10, in which the upper substrate 10 includes a position detection type light detecting element (division-type photodiode or PSD), and the optical block 30 is configured to reflect light emitted from the light emitting element 40 toward a measurement target, and light reflected by the measurement target is incident onto the position detection type light detecting element.

Further, the upper substrate 10 includes the semiconductor substrate main body 10A of the first conductivity type (for example, N-type) having an impurity concentration of $1 \times 10^{18}/cm^3$ or greater; the first semiconductor region 10F of the first conductivity type (for example, N-type) formed on the front surface of the semiconductor substrate main body 10A and having an impurity concentration less than $1 \times 10^{18}/cm^3$; and the single or plural second semiconductor regions 10B of the second conductivity type (for example, P-type) formed in the first semiconductor region 10F, in which the position detection type light detecting element includes the first semiconductor region 10F and the second semiconductor region 10B (see FIG. 9). In the case of the PSD, in a configuration of a longitudinal section thereof, the number of the second semiconductor regions 10B is one, and the configuration is the same as the structure of the half region of the division-type photodiode shown in FIG. 9 in a lateral direction.

Further, the upper substrate 19 further includes the monitor photodiode M, and the optical block 30 is configured to further reflect the light emitted from the light emitting element 40 toward the monitor photodiode M.

Further, the upper substrate 10 includes the semiconductor substrate main body 10A of the second conductivity type (for example, P-type); the first semiconductor region 10G of the first conductivity type (for example, N-type) formed on the front surface of the semiconductor substrate main body; and the single or plural second semiconductor regions 10B of the second conductivity type formed in the first semiconductor region 10G in which the position detection type light detecting element includes the first semiconductor region 10G and the second semiconductor region 10B (FIG. 10). In the case of the PSD, in a configuration of a longitudinal section thereof, the number of the second semiconductor regions 10B is one, and the configuration is the same as the structure of the half region of the division-type photodiode shown in FIG. 10 in a lateral direction.

Further, the optical block 30 includes the half mirror block 30A and the full mirror block 30B that overlaps the half mirror block 30A. The half mirror block 30A includes the first flat transparent plate (main body portion of the half mirror block 30A), and the half mirror layer M1 that is embedded in the first flat transparent plate along the first inclined plane having, as a line normal thereto, a straight line having an angle inclined with respect to a line normal to the front surface of the first flat transparent plate. Further, the full mirror block 30B includes the second flat transparent plate (main body portion of the full mirror block 30B), and the full mirror layer M2 that is embedded in the second flat transparent plate along the second inclined plane having, as a line normal thereto, a straight line having an angle inclined with respect to a line normal to the front surface of the second flat transparent plate.

Further, each of the lower substrate 20 and the upper substrate 10 is provided with a recess that forms a space that accommodates the light emitting element 40.

Furthermore, the position detection type light detecting element is a division-type photodiode or a position sensitive detector (PSD), and the optical sensor may be applied to a tilt sensor.

REFERENCE SIGNS LIST

10 UPPER SUBSTRATE
20 LOWER SUBSTRATE
30 OPTICAL BLOCK
SD DIVISION-TYPE PHOTODIODE
M MONITOR PHOTODIODE

The invention claimed is:
1. An optical sensor comprising:
a light emitting element;
a lower substrate on which the light emitting element is provided;
an upper substrate provided so that the light emitting element is positioned between the upper substrate and the lower substrate; and
an optical block provided on the upper substrate,
wherein the upper substrate includes a position detection type light detecting element, and
wherein the optical block is configured to reflect light emitted from the light emitting element toward a measurement target, and light reflected by the measurement target is incident onto the position detection type light detecting element,
wherein the upper substrate includes
a semiconductor substrate main body of a first conductivity type having an impurity concentration of $1 \times 10^{18}$ /cm$^3$ or greater;
a first semiconductor region of the first conductivity type formed on a front surface of the semiconductor substrate main body and having an impurity concentration of less than $1 \times 10^{18}$ /cm$^3$; and a single or a plurality of second semiconductor regions of a second conductivity type formed in the first semiconductor region, and wherein the position detection type light detecting element includes the first semiconductor region and the second semiconductor region.

2. The optical sensor according to claim 1,
wherein the upper substrate further includes a monitor photodiode, and
wherein the optical block is configured to further reflect the light emitted from the light emitting element toward the monitor photodiode.

3. The optical sensor according to claim 1,
wherein each of the lower substrate and the upper substrate is provided with a recess that forms a space that accommodates the light emitting element.

4. The optical sensor according to claim 1,
wherein the position detection type light detecting element is a division-type photodiode or a position sensitive detector (PSD).

5. An optical sensor comprising:
a light emitting element;
a lower substrate on which the light emitting element is provided;
an upper substrate provided so that the light emitting element is positioned between the upper substrate and the lower substrate; and
an optical block provided on the upper substrate,
wherein the upper substrate includes a position detection type light detecting element and
wherein the optical block is configured to reflect light emitted from the light emitting element toward a measurement target, and light reflected by the measurement target is incident onto the position detection type light detecting element,
wherein the upper substrate includes
a semiconductor substrate main body of a second conductivity type;
a first semiconductor region of a first conductivity type formed on a front surface of the semiconductor substrate main body; and
a single or a plurality of second semiconductor regions of the second conductivity type formed in the first semiconductor region, and
wherein the position detection type light detecting element includes the first semiconductor region and the second semiconductor region.

6. The optical sensor according to claim 5,
wherein the upper substrate further includes a monitor photodiode, and
wherein the optical block is configured to further reflect the light emitted from the light emitting element toward the monitor photodiode.

7. The optical sensor according to claim 5,
wherein each of the lower substrate and the upper substrate is provided with a recess that forms a space that accommodates the light emitting element.

8. The optical sensor according to claim 5,
wherein the position detection type light detecting element is a division-type photodiode or a position sensitive detector (PSD).

9. An optical sensor comprising:
a light emitting element;
a lower substrate on which the light emitting element is provided;
an upper substrate provided so that the light emitting element is positioned between the upper substrate and the lower substrate; and
an optical block provided on the upper substrate,
wherein the upper substrate includes a position detection type light detecting element, and
wherein the optical block is configured to reflect light emitted from the light emitting element toward a measurement target, and light reflected by the measurement target is incident onto the position detection type light detecting element,
wherein the optical block includes a half mirror block, and a full mirror block that overlaps the half mirror block,
wherein the half mirror block includes a first flat transparent plate, and a half mirror layer that is embedded in the first flat transparent plate along a first inclined plane having, as a line normal thereto, a straight line having an angle inclined with respect to a line normal to a front surface of the first flat transparent plate, and
wherein the full mirror block includes a second flat transparent plate, and a full mirror layer that is embedded in the second flat transparent plate along a second inclined plane having, as a line normal thereto, a straight line having an angle inclined with respect to a line normal to a front surface of the second flat transparent plate.

10. The optical sensor according to claim 9,
wherein the upper substrate further includes a monitor photodiode, and
wherein the optical block is configured to further reflect the light emitted from the light emitting element toward the monitor photodiode.

11. The optical sensor according to claim 9,
wherein each of the lower substrate and the upper substrate is provided with a recess that forms a space that accommodates the light emitting element.

12. The optical sensor according to claim 9,
wherein, the position detection type light detecting element is a division-type photodiode or a. position sensitive detector (PSD).

* * * * *